(12) United States Patent
Farhangi (10) Patent No.: US 11,374,139 B2
(45) Date of Patent: Jun. 28, 2022

(54) PATTERNED PHOTOVOLTAIC CELL ARRANGEMENTS IN SOLAR MODULE LAMINATIONS

(71) Applicant: Building Materials Investment Corporation, Dallas, TX (US)

(72) Inventor: Babak Farhangi, Kew Gardens Hills, NY (US)

(73) Assignee: BMIC, LLC, Dallas, TX (US)

( * ) Notice: Subject to any disclaimer, the term of this patent is extended or adjusted under 35 U.S.C. 154(b) by 64 days.

(21) Appl. No.: 16/440,335

(22) Filed: Jun. 13, 2019

(65) Prior Publication Data

US 2020/0020819 A1 Jan. 16, 2020

Related U.S. Application Data

(60) Provisional application No. 62/697,674, filed on Jul. 13, 2018.

(51) Int. Cl.
*H01L 31/046* (2014.01)
*H01L 31/05* (2014.01)
*H01L 31/049* (2014.01)

(52) U.S. Cl.
CPC .......... *H01L 31/046* (2014.12); *H01L 31/049* (2014.12); *H01L 31/0504* (2013.01)

(58) Field of Classification Search
None
See application file for complete search history.

(56) References Cited

U.S. PATENT DOCUMENTS

| 6,008,450 | A | 12/1999 | Ohtsuka et al. |
| 2006/0032527 | A1* | 2/2006 | Stevens ................ H01L 31/048 136/251 |
| 2011/0132427 | A1* | 6/2011 | Kalkanoglu ........ H01L 31/0504 136/244 |
| 2012/0112557 | A1 | 5/2012 | Sager |
| 2012/0176077 | A1 | 7/2012 | Oh et al. |
| 2019/0379322 | A1* | 12/2019 | Britt ..................... H01L 31/049 |

FOREIGN PATENT DOCUMENTS

WO WO2015/133632 A1 9/2015

\* cited by examiner

*Primary Examiner* — Shannon M Gardner
(74) *Attorney, Agent, or Firm* — Womble Bond Dickinson (US) LLP (57) ABSTRACT

A photovoltaic module incorporates a lamination including a back-sheet, an array of solar cells supported on the back-sheet, and a transparent protective covering over the array of solar cells. The solar cells are arranged in offset or staggered patterns on the back-sheet to present a more random and less rigid industrial appearance to an observer. In some cases, cleaved solar cell segments are arranged into groups that are staggered on the back-sheet. This allows for finer control of the net voltage produced by a module. In other embodiments, full single wafer solar cells are arranged into larger groups, which themselves are staggered on the back-sheet. In either case, the result is a photovoltaic module with an appearance that is more organic and acceptable to homeowners and architects than traditional modules having cells arranged in rigid aligned rows and columns.

15 Claims, 8 Drawing Sheets

PATTERNED PHOTOVOLTAIC CELL ARRANGEMENTS IN SOLAR MODULE LAMINATIONS

REFERENCE TO RELATED APPLICATION

Priority is hereby claimed to the filing date of U.S. provisional patent application 62/697,674 entitled Patterned Photovoltaic Cell Arrangements in Solar Module Laminations, which was filed on Jul. 13, 2018. The entire content of this provisional patent application is hereby incorporated by reference.

TECHNICAL FIELD

This disclosure relates generally to solar cell modules for transforming sunlight into electrical energy and more specifically to solar cell modules intended for use on the roof of a home.

BACKGROUND

Photovoltaic or solar cell modules (PV modules) generally comprise an array of individual photovoltaic cells (solar cells) arranged in an array of aligned rows and columns. A typical PV module, for instance, may have a total of 60 solar cells arranged in a 6×10 row and column array beneath a clear protective covering. The exposed surface of each solar cell is negatively charged when exposed to sunlight and the underside surface is positively charged. The individual solar cells are electrically connected in series, in parallel, or a combination to aggregate the energy produced by the solar cells. The solar cells usually are coated with a dark blue color. This regular array of blue cells often is visible to an observer viewing a PV module from a distance. In certain applications, including Building Integrated Photovoltaics (BIPV) and Roof Integrated Photovoltaics (RIPV), the neatly aligned rows and columns of solar cells in a PV module can be considered unsightly by architects and homeowners. It may be considered too industrial-looking for a home.

There has been a trend to make the aligned solar cells of a PV module less noticeable. For example, the dark blue solar cells have been laminated onto black or blue back-sheets or covered with grey glass in an attempt to lend a dark monotone look to the entire PV module. Another trend in the industry is to use smaller numbers of solar cells per PV module such as, for instance, 1, 2, 4, or 8 cells. The resulting PV modules are, of course, much smaller than a standard 60-cell PV module. Each PV module can be about the size of a roofing tile or slate. A non-uniform pattern of solar cells can then be achieved through staggered installation of the tiles or slates. The drawback is that the overall cost is increased compared to installation of standard 60 or 72 cell PV modules. However, these smaller tile-size modules more closely resemble traditional slate shingles.

A need exist for a PV module that eliminates, obscures, or at least disguises the regular row-and-column appearance of solar cells within a PV module without resorting to very small modules, unless small modules are the intent. It is to the provision of an improved PV module that the present invention is primarily directed.

SUMMARY

Briefly described, a PV module includes a lamination of a back-sheet, solar cells on the back-sheet, and a transparent protective covering over the solar cells. The solar cells are arranged in a non-regular or staggered pattern within the lamination. A standard row-and-column installation of PV modules then projects a less industrial look to a distant observer. This represents a significant improvement over PV modules with neatly arranged rows and columns of solar cells installed on the roof of a home. These and other aspects, features, and advantages of the invention will be understood better upon review of the detailed description set forth below when taken in conjunction with the accompanying drawing figures, which are briefly described as follows.

DETAILED DESCRIPTION

Figure 1A:
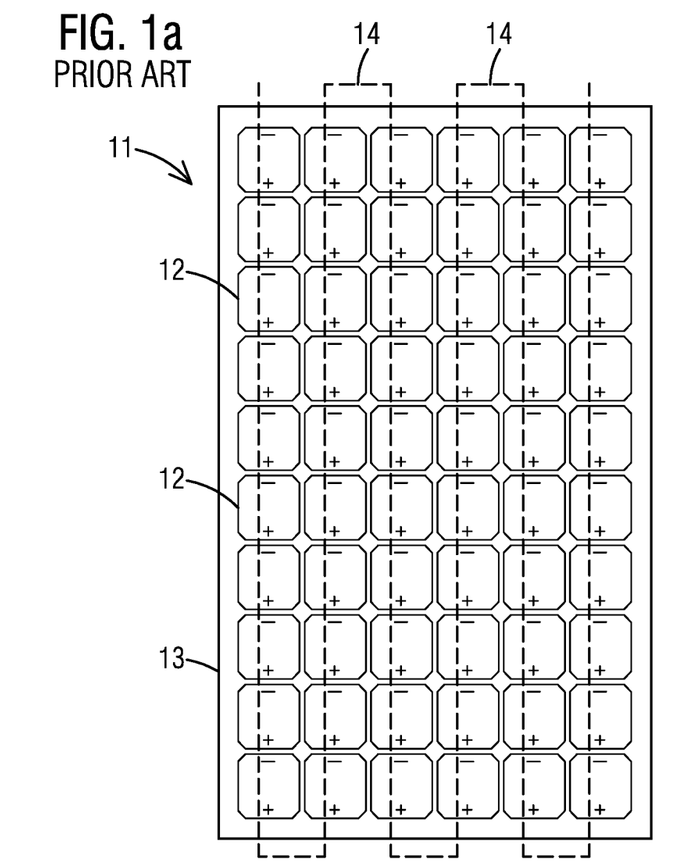
FIG. 1a illustrates the typical prior art solar cell arrangement in a standard 60-cell laminated solar module and FIG. 1b approximates the appearance of the dark modules when cells are hidden by blending with a dark back-sheet.
Figure 1B:
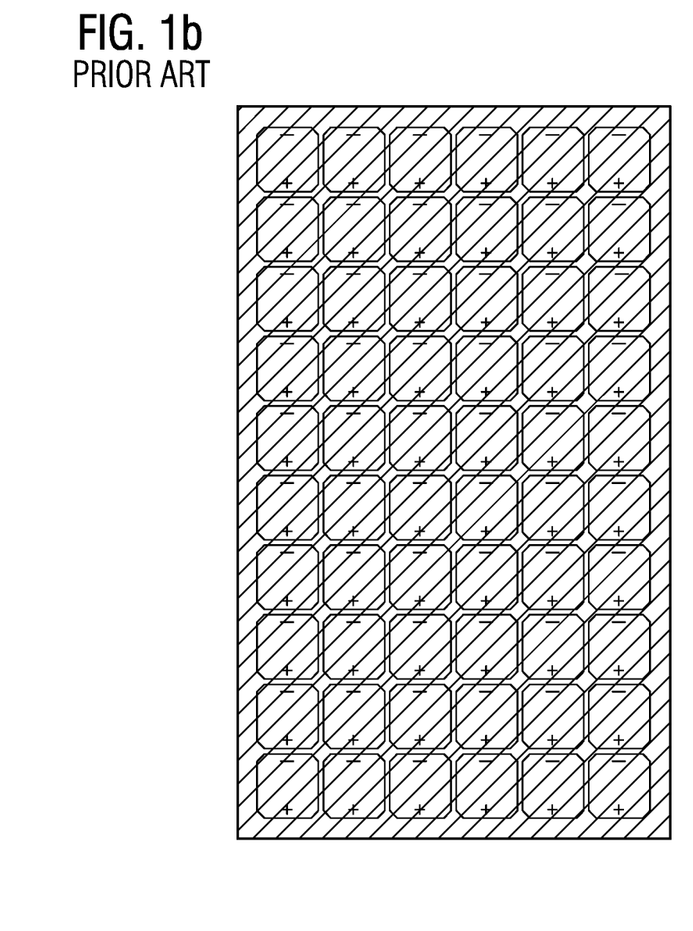

Reference will now be made to the various drawing figures, wherein reference numerals are sometimes used to identify various parts and aspects of the illustrated embodiments. FIGS. 1a and 1b show a popular prior art 60-cell PV module lamination 11. As shown in FIG. 1a, individual solar cells 12 are arranged on a substrate or back-sheet 13 in a regular array of aligned rows and columns—10 rows by six columns in this example. The solar cells are electrically connected in series in this case as indicated by dashed current flow lines 14 so that the total voltage produced by the PV module is roughly 60 times the voltage produced by a single solar cell. Of course, other electrical connection matrices exist as well including parallel connections and combinations of parallel and serial connections.

In FIG. 1b, the solar cells of the lamination are mounted on a dark back-sheet and covered with a dark or smoky colored glass protective covering. This is sometimes done in the prior art to help obscure the appearance of the regular row and column pattern of the solar cells. However, since the protective covering must be as transparent to sunlight as possible in the visible part of the spectrum (380 nm to 750 nm), the aligned array of individual solar cells still are visible through the protective covering.

Figure 2A:
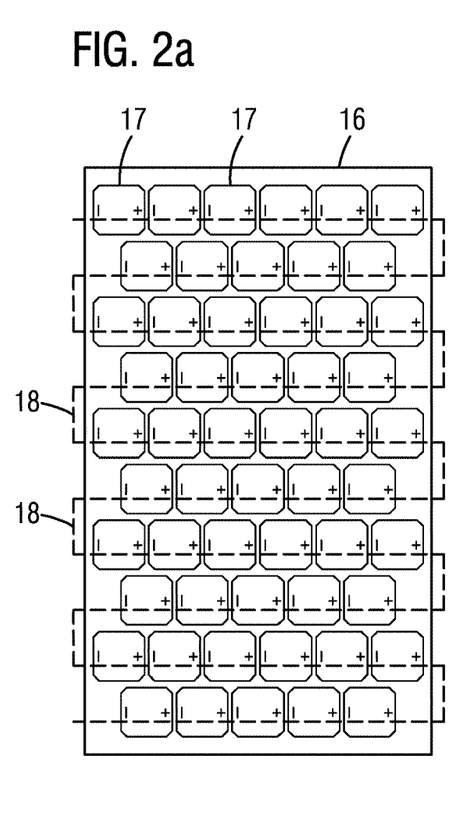
FIGS. 2a, 2b, and 2c illustrate three embodiments of solar cell arrangements in a solar module lamination according to principles of the present invention.
Figure 2B:
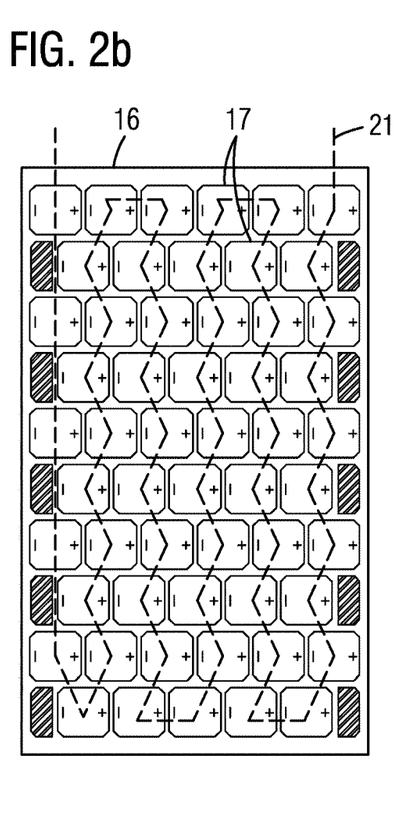
Figure 2C:
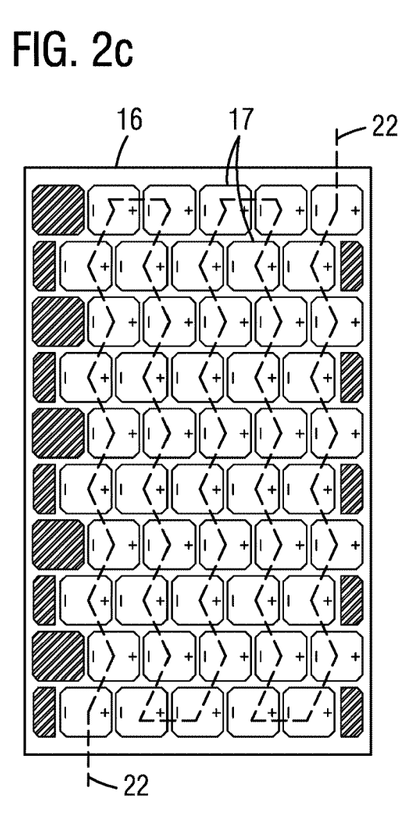

FIGS. 2a, 2b, and 2c show three example embodiments of a solar lamination according to principles of the present invention. Here, a few individual solar cells are omitted from alternate rows of the array of solar cells to free up space. Remaining solar cells in these rows are offset or staggered with respect to the other rows. In FIG. 2a, the solar cells 17 in odd rows (1, 3, 5 . . . ) of solar cells are arranged in the traditional pattern within the lamination 16, e.g. 6 cells across in this example. One solar cell is removed from the even rows (2, 4, 6 . . . ) and these rows are shifted right or left by one-half (or some other fraction) of the width of a solar cell. In this example, the solar cells 17 are electrically connected in series creating a current flow path shown by dashed line 18 to aggregate the electrical energy or voltage produced by the individual solar cells. Other electrical connection strategies are possible. This results in a 55-cell PV module with a staggered solar cell array.

FIG. 2b illustrates the same staggered arrangement of solar cells in a lamination as in FIG. 2a with the addition of dummy solar cells 22 filling gaps at the ends of the even rows of solar cells. The electrical connection here also is a series connection creating a current flow path indicated by the dashed line 21.

FIG. 2c shows an alternate staggered arrangement of solar cells in a lamination. Here, one solar cell is omitted from each row of solar cells. Remaining cells in odd rows are not repositioned and a full dummy solar cell (hatched) is positioned at the left ends of the odd rows. Solar cells in even rows are shifted by one-half cell and a half dummy cell is positioned at each end of these even rows. An advantage of this configuration is that each row contains the same number of solar cells, which is desirable in some instances. Both whole and half dummy solar cells fill the spaces at the ends of the rows. In FIG. 2c, the electrical interconnection again is a series connection with the current flow path indicated by the dashed line 23. As with all the embodiments, alternate electrical connection strategies are possible.

Figure 3:
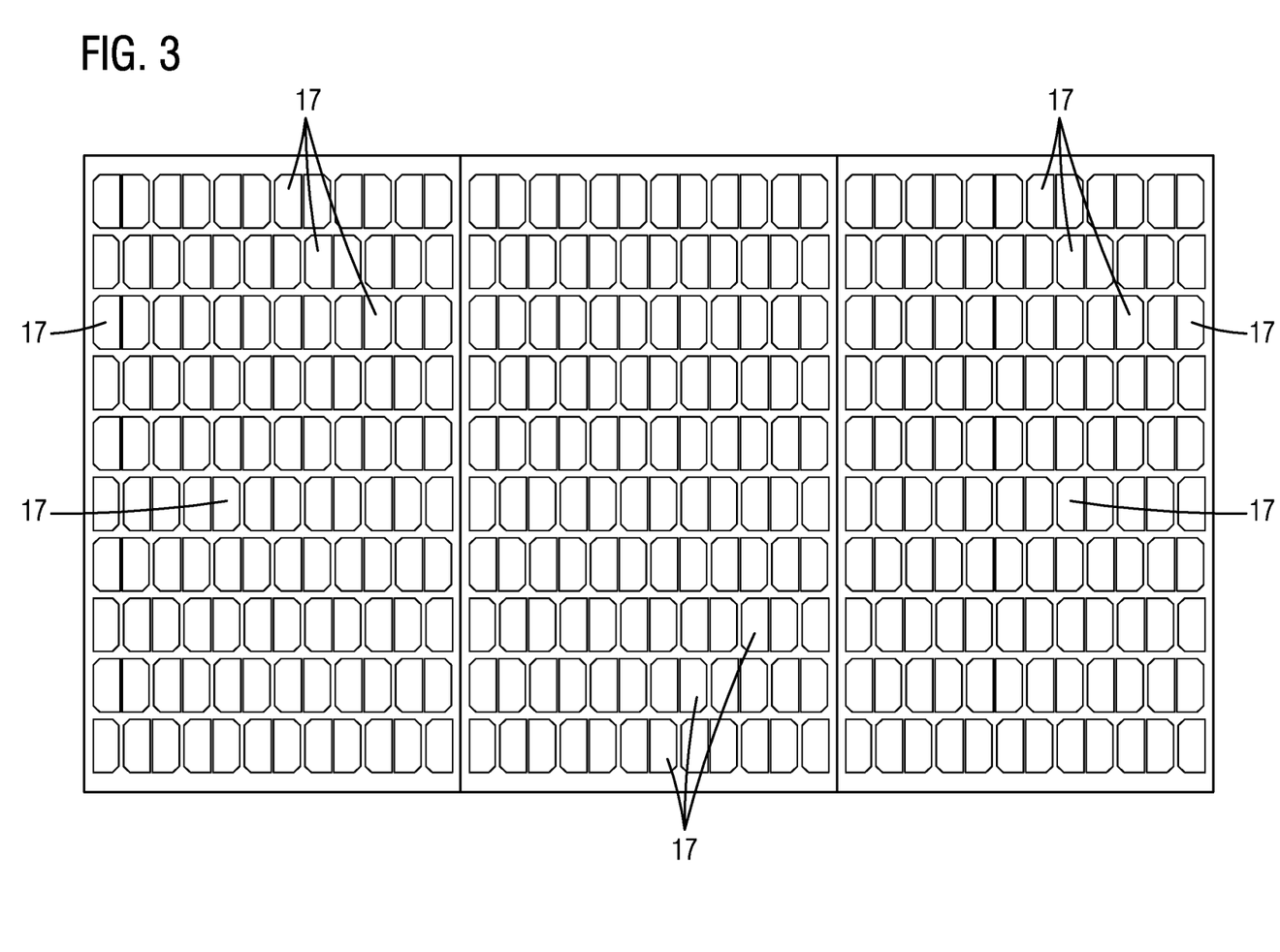
FIG. 3 illustrates an alternate embodiment of a solar cell arrangement in a solar module lamination utilizing divided or cleaved solar cells.

FIG. 3 shows three side-by-side solar modules exemplifying an alternate embodiment of the present invention. Here, full-size solar cells (typically 6 inches by 6 inches) are cleaved (i.e. cut) into smaller cell segments (one-half cell segments in this example). The one-half cell segments are then arranged at the ends of alternate rows of solar cells that have been shifted by one-half cell width. The benefit is that a similar footprint and similar size module as a standard aligned array PV module is created.

In FIG. 3, odd rows of individual solar cells 17 contain full-size solar cells formed by arranging two half-cell segments edge-to-edge. The full-size solar cells also can be standard un-cleaved solar cells if desired. Even rows of individual cells start and end with cleaved solar cells (one-half cell segments in this example). The full-size cells (if used) and the cleaved cell segments all are active. This presents an improved staggered appearance while maintaining the same total solar cell area as a standard PV module. Using all cleaved cell segments has certain advantages, as described in more detail below.

Figure 4A:
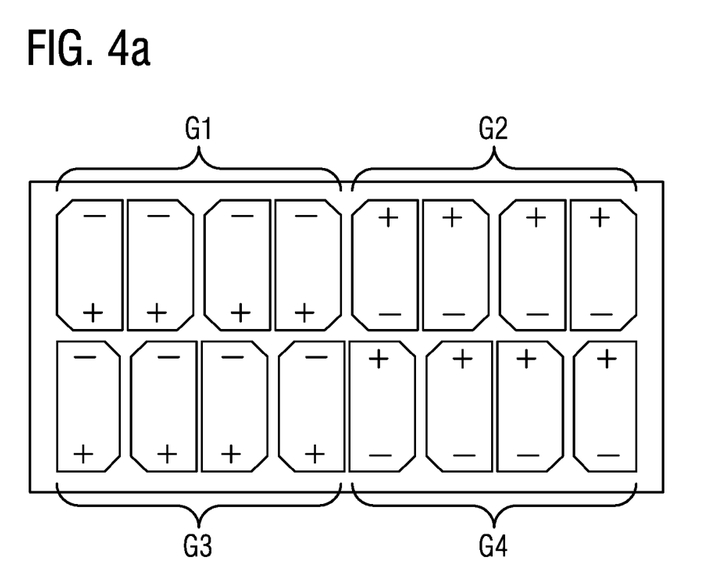
FIGS. 4a-4c illustrate three examples of a staggered cleaved solar cell arrangement according to principles of the invention.
Figure 4B:
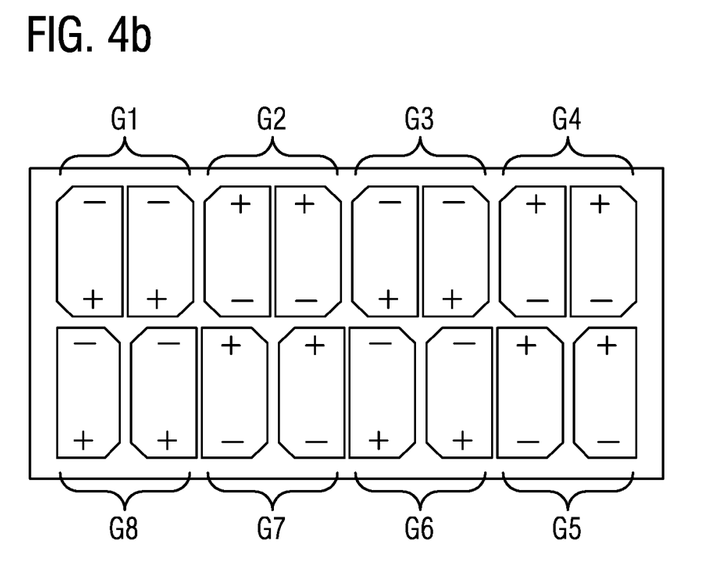
Figure 4C:
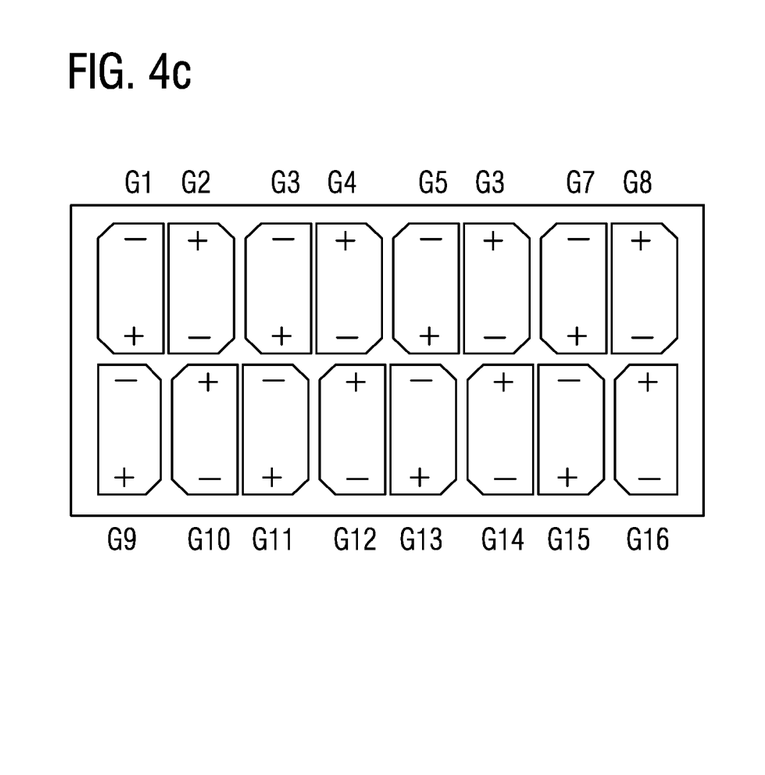

Benefits of using cleaved solar cell segments in a PV module include the ability to modify or tailor more finely the voltage produced by the PV module. FIGS. 4a-4c show three examples of how arranging half-cell segments with respect to each other can tailor the resulting voltage output. In the arrangement of FIG. 4a, the solar cells that appear to be full-size (hereinafter "full solar cells") are formed from two cleaved half-cell segments arranged edge-to-edge. In contrast to actual full-size solar cells, which exhibit a single polarity (exposed surface negative and underside surface positive), full solar cells made from cleaved cell segments can be created with differing polarities in the same solar cell footprint. The examples in FIGS. 4a-4c are for 8 total solar cells made from 16 half-cell segments. However, the principle illustrated is scalable to larger modules. All of the half-cell segments including the half-cells of each full cell and the individual half-cell segments are usable within the electrical interconnection scheme.

In FIG. 4a, half-cell segments are arranged to mimic full-size solar cells and to fill spaces at the ends of shifted rows. The solar cells in this example define four solar cell groups G1-G4. The half-cell segments of each group of solar cells are connected in parallel to produce a group voltage that is the same as the voltage of a single half-cell segment. The four groups G1-G4 are, in turn, connected in series. The result is a PV module with a net voltage of four times the voltage of a single solar cell group G1-G4. In FIG. 4b, each pair of adjacent half-cell segments are connected in parallel forming groups G1-G8, each group having a single polarity. Each group is connected in series with the other groups. The net voltage of the PV module in this case is about eight times the voltage of a single half-cell. Finally, in FIG. 4c, each half-cell segment forms its own group G1-G16 and all 16 groups are connected in series. The net PV module voltage in this case is about sixteen times the voltage of a singly half-cell segment.

Figure 5:
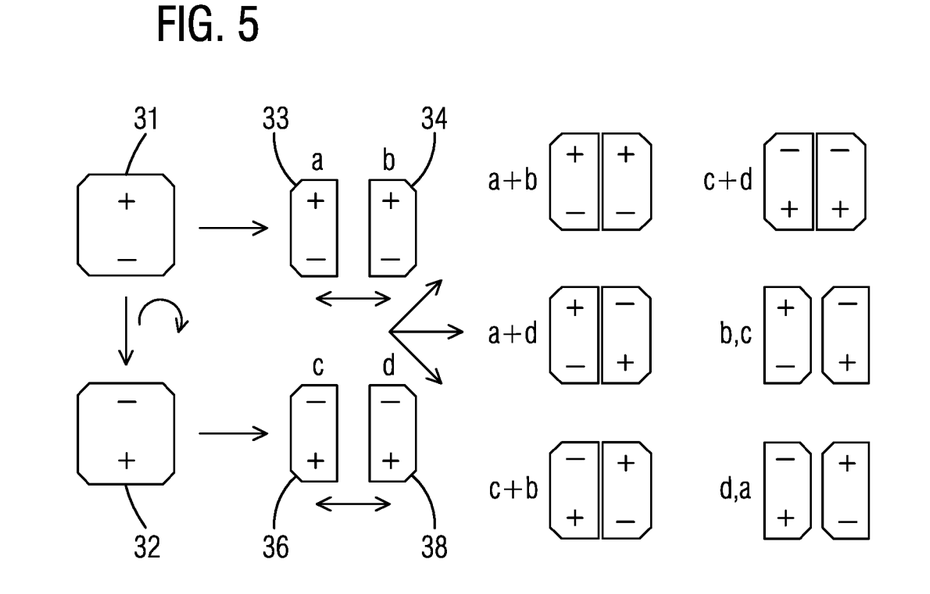
FIG. 5 illustrates the cleaving of solar cells and various combinations of the cleaved solar cells to produce variations of solar cell polarity configurations.

FIG. 5 illustrates how full-size single wafer solar cells can be cleaved with the resulting half-cell segments being arranged to form various configurations of groups for use in a PV lamination. The process begins with two full-size single wafer solar cells 31 (single wafer cells) and 32 with wafer 32 simply being wafer 31 flipped over as indicated by the circling arrow in FIG. 5. The two single wafer cells 31 and 32 are then cleaved to form four half-cell segments 33, 34, 36, and 38. Each half-cell segment has its own independent polarity.

The half-cell segments can then be combined and/or arranged as shown to form various configurations including edge-to-edge arrangements that result in a pair of half-cell segments that has the footprint of a full wafer cell. For instance, a+b, a+d, b+c and c+d arrangements can be made with edge-to-edge arrangements of half-cell segments. Each resulting combination has a different polarity pattern, which provides advantages such as those discussed above. Several interconnecting schemes are applicable. Generally, cells within the same polarities can be interconnected in parallel (positive to positive and negative to negative). Cells with different polarities can be interconnected in series. Within the module, through a network of such interconnections, the desired current flow pattern can be achieved.

As long as an even number of half-cell segments is produced, all cell segments are usable in a PV module lamination, and no cell or cell segment is wasted. Arrangements b, c and d, a also approximate the footprint of a single wafer cell and can be used in lieu of a single wafer cell. Of course, the half-cell segments themselves can be used at the ends of shifted rows of solar cells in a solar panel as discussed.

Figure 6A:
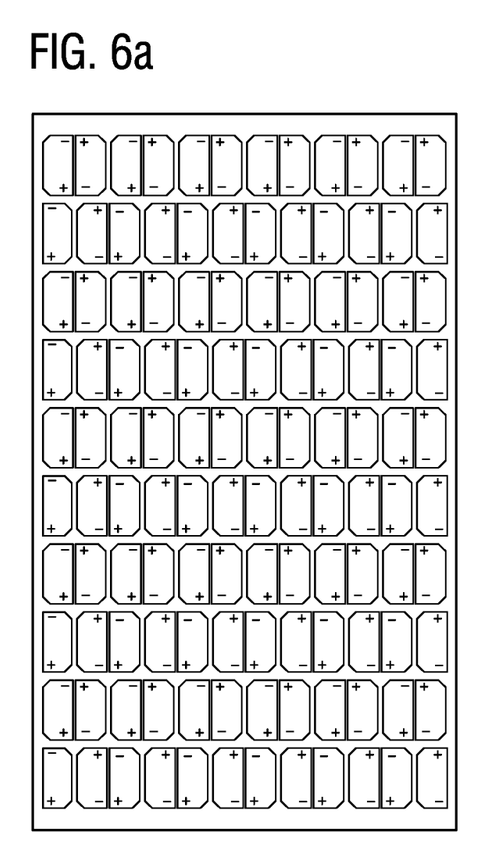
FIGS. 6a and 6b illustrate two 60 cell solar cell modules with different staggered solar cell arrangements incorporating cleaved cells.
Figure 6B:
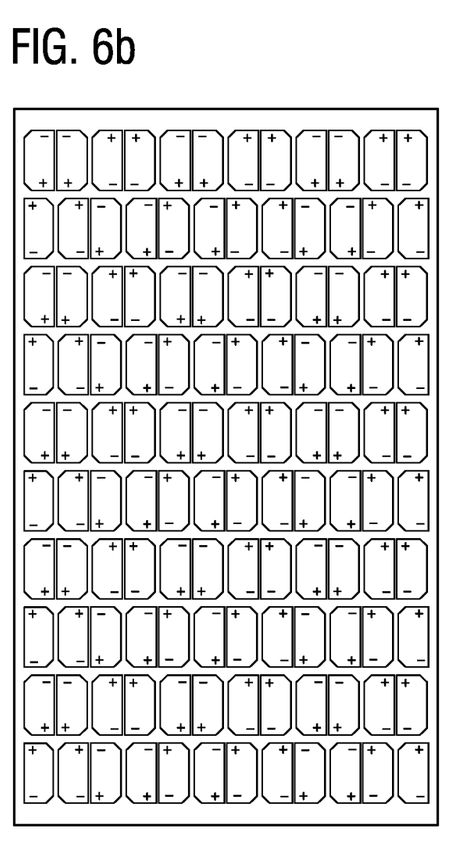

FIGS. 6a and 6b illustrate two exemplary embodiments of a full scale PV module utilizing 120 cleaved cell segments. With the arrangement and polarities of cell groups in FIG. 6a, the net voltage produced by the resulting PV module is about twice the voltage of a standard prior art 60-cell solar module. The arrangement and polarities of cell groups in FIG. 6b results in a net module voltage that is about the same as that produced by a prior art 60-cell module having full cell wafers arranged in aligned rows and columns.

Another exemplary embodiment of the invention involves the merging of full single wafer solar cells into solar cell groups as opposed to cleaving single wafer cells and arranging the resulting cell segments into groups as described above. In this embodiment, traditional single wafer solar cells are arranged together to form larger solar cell groups and the larger groups are arranged in a staggered pattern in a PV module lamination. In other words, the gap (spacing) between the multi-cell groups (cell segments) is greater than the gap (spacing) between the cells within the groups. Multi-cell groups may be formed from any arbitrary number of full cells and/or divided cells, which has been explained above. One module may include one or several arrangements of such multi-cell groups.

Figure 7:
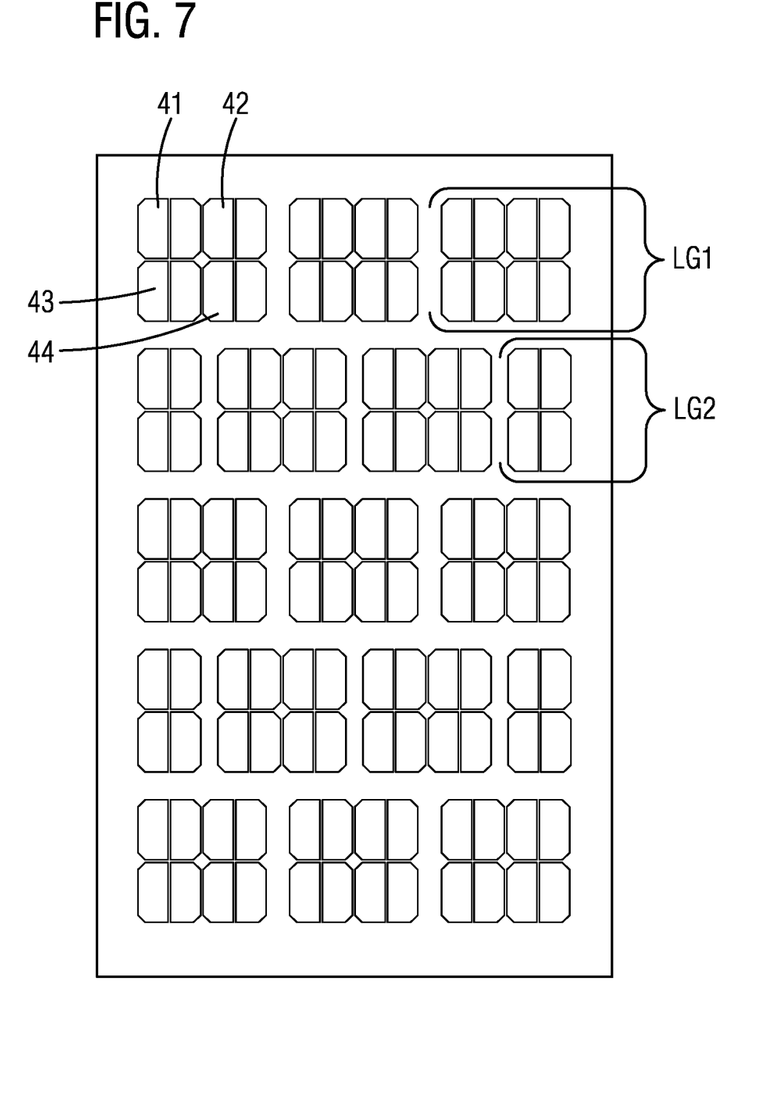
FIG. 7 illustrates a 60 cell photovoltaic module with cells configured in a staggered pattern using 4-cell and 2-cell segments.

FIG. 7 illustrates an example of this embodiment. Individual full wafer solar cells 41, 42, 43, and 44 are arranged into one or more larger multi-cell groups. For instance, LG1 in FIG. 7 shows a larger four cell group formed from four full single wafer cells and LG2 shows a smaller two cell group from two full single wafer cells. The two cell group LG2 is half the width of group LG1. In FIG. 7, there are a total of 60 solar cells and all the solar cells are electrically connected in series. However, the staggered pattern of the cell groups breaks up the cell groups and produces a more pleasing and less rigid appearance.

Figure 8:
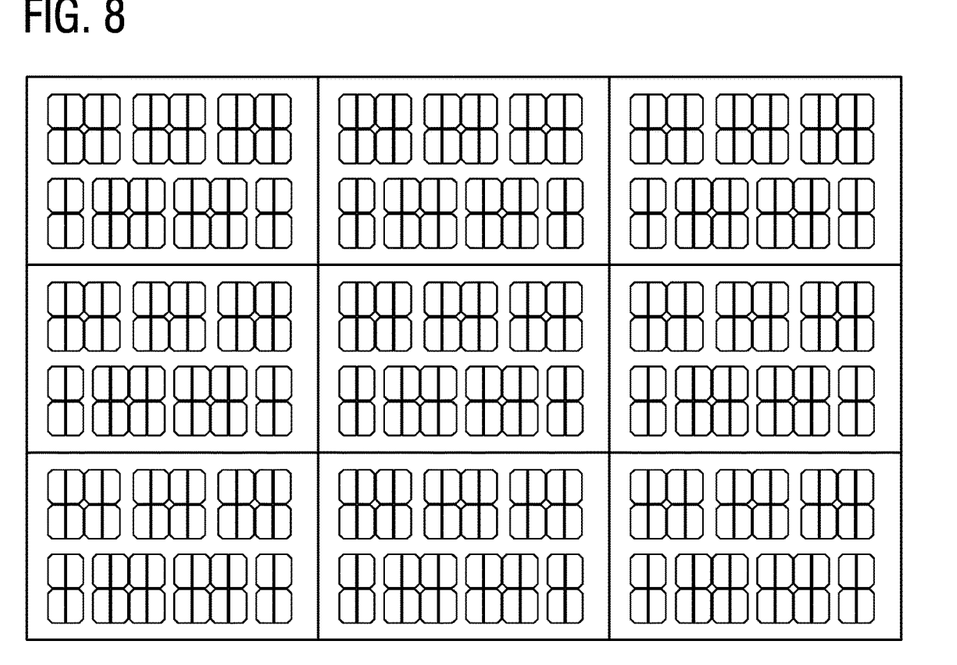
FIG. 8 illustrates an array of 24-cell-each PV modules incorporating cleaved solar cells according to principles of the invention.

FIG. 8 illustrates the use of the grouped full single wafer cell embodiment of the invention in a smaller PV module of just 24 individual solar cells each. Shown are nine PV modules of this type arranged in a side-by-side and top-to-bottom array. Each of the nine PV modules includes a total of 24 individual full single wafer solar cells merged to form 5 groups of four cells (full groups) and two groups of two cells (half groups). It can be seen in FIG. 8 that even though the PV modules are arranged in aligned rows and columns, the overall appearance of the installation is dominated by the staggered groups of solar cells. This gives the installation a less rigid less industrial look from the ground and is better suited for use on residential homes. Further, the PV modules themselves can be installed in non-aligned patterns such as overlapping patterns if desired to avoid a rigid pattern of solar cells even more.

Figure 9:
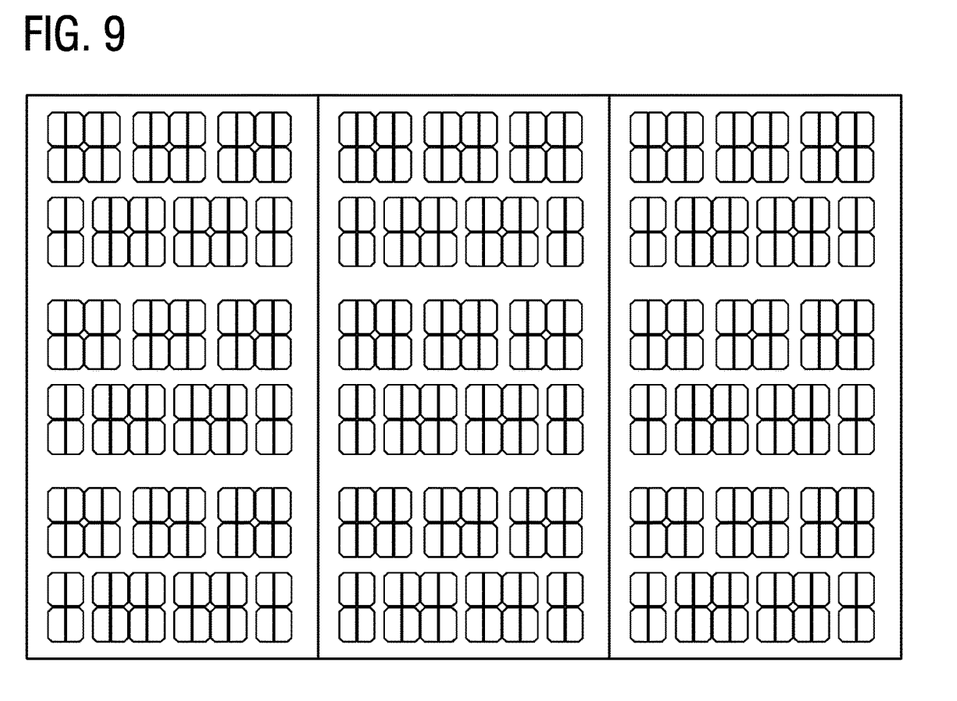
FIG. 9 illustrates an array of 72-cell each photovoltaic modules incorporating cleaved solar cells according to principles of the invention.

FIG. 9 illustrates the grouped single wafer cell embodiment of the invention applied to a larger 72 cell PV module. FIG. 9 illustrates three 72 cell PV modules arranged side-by-side with each module incorporating the staggered merged group concept. Again, even though the PV modules are arranged in an ordered side-by-side array, the overall appearance of the installation presents a more organic less industrial look better suited to homes and more acceptable to homeowners and architects.

The invention has been described herein in terms of preferred embodiments and methodologies considered by the inventors to represent the best mode of carrying out the invention. However, these embodiments and methodologies are in no way intended to be limiting or confining, but represent only examples of how the invention might be carried out. A wide gamut of additions, deletions, and modifications, both subtle and gross, might well be made to the embodiments described herein without departing from the spirit and scope of the invention itself.

What is claimed is:

1. A roof system, comprising:
a plurality of solar modules, each solar module comprising:
a single back-sheet having a length and a width;
a plurality of solar cells supported on the back-sheet, the solar cells being arranged on the back-sheet in a predetermined pattern of solar cells;
wherein the predetermined pattern comprises an array of solar cells including at least three rows of solar cells extending substantially parallel to each other across the width of the back-sheet, each row comprising a plurality of spaced solar cells, the rows being spaced apart along the length of the back-sheet, with each row of solar cells being shifted across the width of the back-sheet with respect to at least one adjacent row of solar cells;
the solar cells of each row being electrically interconnected in series along the back-sheet, with at least a first one of the solar cells of a row of solar cells electrically connected to a second one of the solar cells of the row of solar cells so as to define a current flow path configured to aggregate electrical energy produced by the solar cells; and
a protective covering overlying the solar cells;
wherein at least some of the solar cells comprise single wafer solar cells having a solar cell footprint, and wherein at least some of the solar cells comprise half-cell segments of solar cells cleaved from single wafer solar cells, at least some of the half-cell segments of solar cells positioned along the back-sheet in an edge-to-edge arrangement to form a solar cell having approximately a same size solar cell footprint as the solar cell footprint of the single wafer solar cells;
wherein the half-cell segments have independent polarities and are arranged with respect to adjacent half-cell segments to form groups of half-cell segments with predetermined polarity configurations;
wherein the half-cell segments are arranged in groups of at least two half-cell segments, and the groups of half-cell segments are electrically interconnected in a predetermined circuit configuration.

2. The roof system of claim 1, further comprising at least one solar panel incorporating the solar cell module of claim 1.

3. The roof system as claimed in claim 1 wherein each row of solar cells is shifted by one-half the width of a solar cell.

4. The roof system as claimed in claim 3 further comprising half-cell segments having a width approximately half a width of the solar cells located at the ends of the shifted rows to fill the space left by the shifting of the shifted rows.

5. The roof system as claimed in claim 4 wherein at least some of the half-cell segments comprise dummy cell segments that do not produce electrical energy.

6. The roof system as claimed in claim 1 wherein the shifted rows result in unfilled spaces at the ends of the rows of solar cells and wherein some of the spaces are filled with half-cell sized segments and some of the spaces are filled with full cell sized segments.

7. The roof system as claimed in claim 6 wherein at least some of the half-cell sized segments comprise dummy cell segments that do not produce electrical energy when exposed to sunlight, and at least some of the half-cell sized segments comprise half-cell sized segments of solar cells that produce electricity when exposed to sunlight.

8. The roof system as claimed in claim 7 wherein the full cell sized segments are dummy segments that do not produce electrical energy when exposed to sunlight.

9. The roof system as claimed in claim 1 wherein at least some of the groups of half-cell segments comprise groups of four half-cell segments.

10. A solar cell module comprising:
a single back-sheet having a length and a width;
a plurality of solar cells supported on the back-sheet, the solar cells being arranged on the back-sheet in a predetermined pattern comprising an array of solar cells including at least three rows of solar cells extending substantially parallel to each other across the width of the back-sheet, each row comprising a plurality of spaced solar cells, the rows being spaced apart along the length of the back-sheet, with each row of solar cells being shifted across the width of the backing sheet with respect to at least one adjacent row of solar cells;
the solar cells of each row being electrically interconnected in series with at least a first one of the solar cells of a row of solar cells electrically connected to a second one of the solar cells of the row of solar cells so as to define a current flow path configured to aggregate the electrical energy produced by the solar cells, wherein at least some of the solar cells comprise cell segments of solar cells; and
a protective covering overlying the solar cells;
wherein the cell segments comprise half-cell segments of solar cells positioned along the back-sheet in an edge-to-edge arrangement to form solar cells each having approximately a same size solar cell footprint as a footprint of a single wafer solar cell.

11. A solar cell module as claimed in claim 10, wherein alternating ones of the half-cell segments are rotated to align polarities thereof with polarities of adjacent half-cell segments.

12. A solar cell module as claimed in claim 10, wherein the solar cells comprise a plurality of groups of solar cells, each group of solar cells being spaced from other groups of solar cells at a spacing greater than a spacing between the solar cells within each group of solar cells.

13. A roof system, comprising:
a plurality of solar modules, each solar module comprising:
a single back-sheet having a length and a width;
a plurality of solar cells supported on the back-sheet, the solar cells being arranged on the back-sheet in a predetermined pattern of solar cells;
wherein the predetermined pattern comprises an array of solar cells including at least three rows of solar cells extending substantially parallel to each other across the width of the back-sheet, each row comprising a plurality of spaced solar cells, the rows being spaced apart along the length of the back-sheet, with each row of solar cells being shifted across the width of the back-sheet with respect to at least one adjacent row of solar cells;
the solar cells of each row being electrically interconnected in series along the back-sheet, with at least a first one of the solar cells of a row of solar cells electrically connected to a second one of the solar cells of the row of solar cells so as to define a current flow path configured to aggregate electrical energy produced by the solar cells; and
a protective covering overlying the solar cells;
wherein the solar cells comprise half-cell segments of solar cells positioned along the back-sheet in a substantially edge-to-edge arrangement to form solar cells each having approximately a same size solar cell footprint as a footprint of single wafer solar cells.

14. A roof system as claimed in claim 1, wherein unfilled spaces are defined at ends of at least some of the rows of solar cells, wherein some of the spaces are filled with half-cell sized segments and some of the spaces are filled with full cell sized segments; and
wherein some of the half-cell sized segments and some of the full cell sized segments comprise dummy cell segments that do not produce electrical energy when exposed to sunlight.

15. A roof system, comprising:
a plurality of solar modules, each solar module comprising:
a single back-sheet having a length and a width;
a plurality of solar cells supported on the back-sheet, the solar cells being arranged on the back-sheet in a predetermined pattern of solar cells;
wherein the predetermined pattern comprises an array of solar cells including at least three rows of solar cells extending substantially parallel to each other across the width of the back-sheet, each row comprising a plurality of spaced solar cells, the rows being spaced apart along the length of the back-sheet, with each row of solar cells being shifted across the width of the back-sheet with respect to at least one adjacent row of solar cells;
the solar cells of each row being electrically interconnected in series along the back-sheet, with at least a first one of the solar cells of a row of solar cells electrically connected to a second one of the solar cells of the row of solar cells so as to define a current flow path configured to aggregate electrical energy produced by the solar cells; and
a protective covering overlying the solar cells;
wherein all of the solar cells comprise adjacent half-cell segments of solar cells positioned on the back-sheet in a substantially edge-to-edge arrangement.

* * * * *